United States Patent [19]

Couvillon

[11] Patent Number: 4,466,128
[45] Date of Patent: Aug. 14, 1984

[54] AUTOMATICALLY CENTERED PULSED FM RECEIVER

[75] Inventor: James B. Couvillon, Dallas, Tex.

[73] Assignee: Texas Instruments Incorporated, Dallas, Tex.

[21] Appl. No.: 225,174

[22] Filed: Jan. 15, 1981

[51] Int. Cl.³ ............................................ H03J 7/10
[52] U.S. Cl. ................... 455/208; 329/139; 455/259; 455/263; 455/340
[58] Field of Search ............... 329/122, 139, 154, 179; 375/97; 358/19, 158; 455/192, 208, 257, 258, 259, 261, 262, 264, 339, 340

[56] References Cited

U.S. PATENT DOCUMENTS 3,569,835  3/1971  Harner ................................ 455/208
3,610,955  10/1971  Blaser et al. ........................ 358/19
3,686,574  8/1972  Niman ................................ 455/259
3,859,631  1/1975  Holmes et al. ...................... 375/97

Primary Examiner—Benedict V. Safourek
Attorney, Agent, or Firm—Alva H. Bandy; N. Rhys Merrett; Melvin Sharp

[57] ABSTRACT

Disclosed is a pulsed FM receiver with automatic centering of the intermediate frequency at the true center of the input filter passband. The frequency standard of the frequency discriminator which controls the local oscillator frequency is adjusted to produce zero discriminator output during the period between signal pulses. The discriminator frequency standard remains automatically aligned with the center of the input filter passband and the input bandwidth may then be reduced for optimum receiver sensitivity.

12 Claims, 5 Drawing Figures

AUTOMATICALLY CENTERED PULSED FM RECEIVER

STATEMENT OF GOVERNMENT INTEREST

The present invention may be made or used by or on behalf of the Government of the United States without the payment of any royalties thereon or therefor.

This invention relates to RF receivers and more particularly to an improved automatically centered pulsed FM receiver.

The basic operation of RF, radio frequency, receivers in detecting FM, frequency modulated, signals is well known in the art. The received RF signal is normally mixed with an LO, local oscillator, signal to generate an IF, intermediate frequency, signal. The IF signal is then filtered and amplified prior to being detected by a detector. The detector of interest to the embodiment of the present invention is a frequency discriminator which compares the IF signal to an internal frequency standard and generates a video output proportional to the frequency difference. The internal frequency standard may be an oscillator tuned to the nominal IF or a filter having its center frequency tuned to the nominal IF. The video output signal is the FM information carried by the RF signal.

If the LO operates at a fixed frequency then the IF signal will have bandwidth equal to that of the received RF signal. The IF filter must have enough bandwidth to pass all of this desired signal. But since the noise which passes the filter is proportional to the filter bandwidth it is desirable to use the narrowest possible bandwidth. One method of reducing bandwidth of the IF filter is to use AFC, automatic frequency control.

AFC circuitry comprises a variable frequency LO having a frequency control input driven by the discriminator output. This feedback arrangement adjusts the LO frequency so that the IF signal is kept at the discriminator internal standard frequency. This internal standard frequency and the receiver filter center frequency are initially set at the nominal intermediate frequency. For maximum system sensitivity the receiver filter bandwidth would be reduced to a minimum consistent with the width of the input spectrum. But the discriminator standard frequency and the filter center frequency both drift with age and temperature and the conventional AFC will not maintain the IF at the true filter center frequency. The normal solution to this problem is to increase the filter bandwidth to compensate for the worst expected frequency drifts. This solution also decreases system sensitivity by allowing more noise to pass the filter.

Accordingly, it is an object of the present invention to provide an improved automatically centered pulse FM receiver.

It is also an object of the present invention to provide a pulsed FM receiver having an input bandwidth optimized for maximum sensitivity.

It is a further object of the present invention to provide a pulsed FM receiver having a discriminator frequency standard which is automatically adjusted to the actual center of the receiver input passband.

The above and other objects are achieved by providing an adjustable frequency standard for the frequency discriminator of a pulsed FM receiver. The adjustable standard is driven by the output of the discriminator between signal pulses. Receiver preamplifier noise passing through the receiver input filters is centered at the bandpass filter center frequency and any discriminator output indicates the frequency standard error. The error is reduced to zero by feedback from the discriminator output to a tuning element in the frequency standard. The discriminator signal to the local oscialltor during signal pulses then centers the IF signal on the actual input passband.

Other objects, features and advantages of this invention will become better understood by reference to the following detailed description when read in conjunction with the accompanying drawings wherein:

FIG. 5 is a schematic diagram of the IF amplifiers of FIG. 2.

Figure 1:
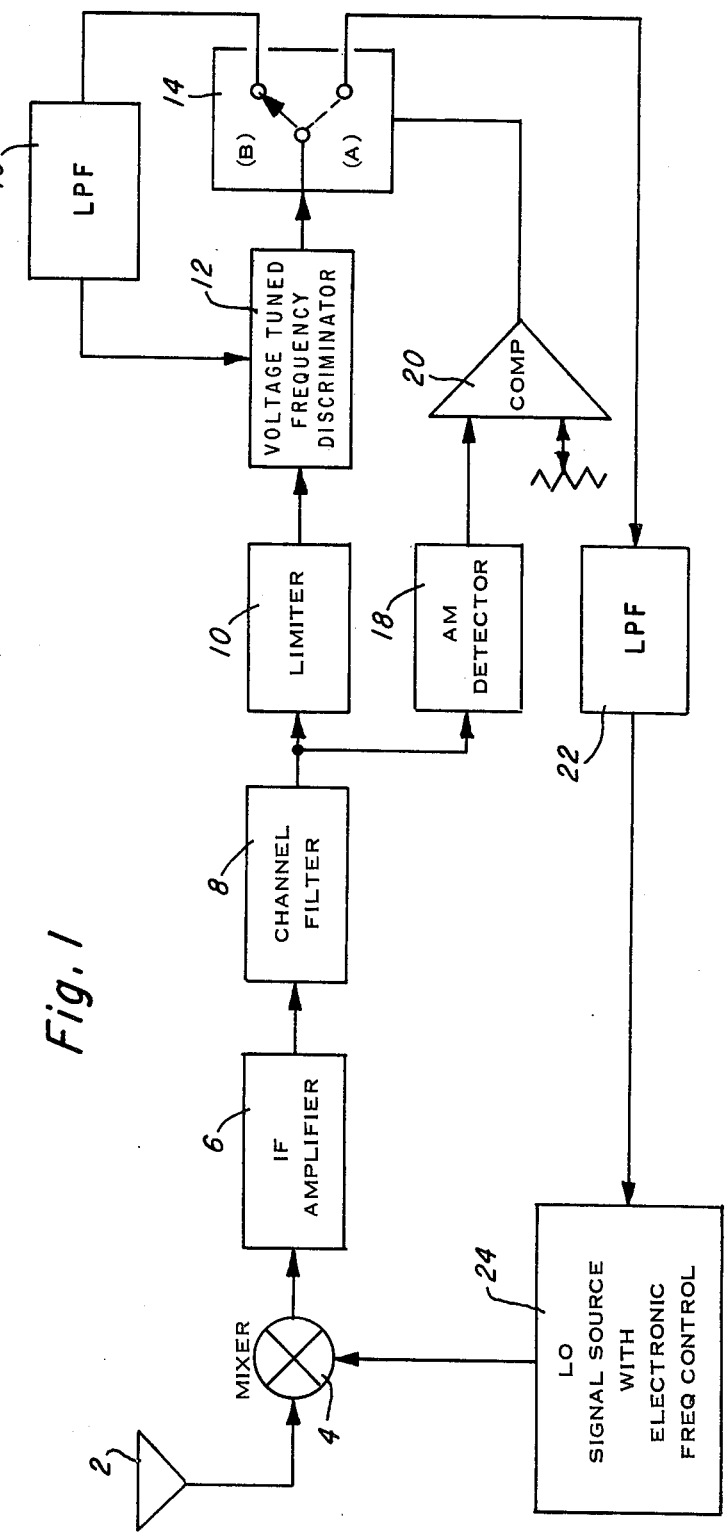
FIG. 1 is a functional block diagram of an automatically centered pulsed FM receiver.

Referring to FIG. 1, a complete pulsed FM receiver comprising the present invention is shown in block diagram form. RF signals are received by an antenna 2 and coupled to a mixer 4 to generate IF signals by being mixed with a signal from a local oscillator 24. The IF signal is coupled to an amplified by IF amplifier 6 and then passed through bandpass filter 8. The filtered IF signal is coupled to limiter amplifier 10 and amplitude modulation detector 18. The output of limiter amplifier 10 drives one input of frequency discriminator 12. The output of detector 18 drives comparator 20 which in turn drives a switch 14. Switch 14 controls the output of frequency discriminator 12 so that it is coupled through low pass filter 22 to the local oscillator 24 when an Rf signal is being received and is coupled through low pass filter 16 back to the frequency standard control input of frequency discriminator 12 when the RF signal is not being received.

During the time when an RF signal is being received when switch 14 is in position A, the receiver operates like a conventional FM receiver with AFC as described above. The frequency discriminator 12 compares the IF signal to its internal frequency standard and produces an output proportional to the frequency difference. This signal controls the local oscillator 24 frequency to adjust the IF until it is substantially the same as the discriminator frequency standard. The discriminator output is a video signal containing the FM information carried by the received RF signal.

During the periods of no RF reception, when switch 14 is in position B, the output of the frequency discriminator is proportional to the difference in frequency between the center frequency of the noise generated by amplifier 6 and filtered by filter 8 and the discriminator frequency standard. Since the amplifier 6 noise is broadband white noise, the noise energy passing through filter 8 will be centered at the center of the filter passband. This filter center frequency is the optimum IF signal frequency to allow minimum filter bandwidth. The frequency discriminator output therefore represents the actual error of the discriminator reference frequency with respect to the filter 8 center frequency. This error signal is coupled back to discriminator 12 to adjust the frequency standard until the error is zero, that is until the frequency standard equals the filter 8 center frequency.

The low pass filters 16 and 22 maintain the error feedback signals in each path essentially constant during the period of no feedback in the respective path. In very low duty cycle receivers, such as the preferred embodiment, the discriminator output may be continuously fed back to the discriminator frequency standard input. Filter 16 averages the feedback signals so that discriminator output during signal reception periods has essentially no effect on the standard frequency.

Figure 2:
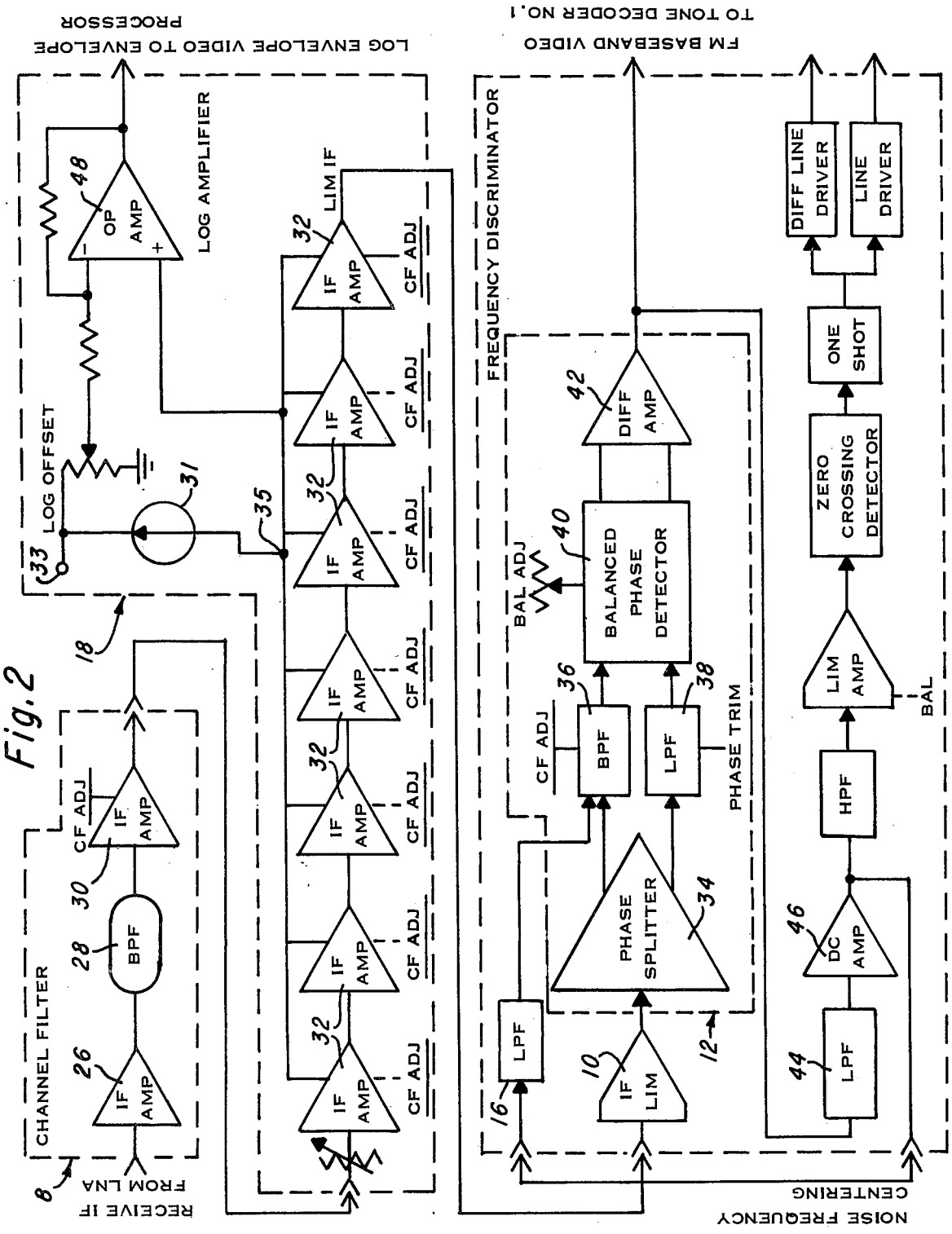
FIG. 2 is a more detailed block diagram of the channel IF portion of the preferred embodiment of the present invention.

In FIG. 2 elements 8, 10, 12, 16 and 18 of FIG. 1 are shown in more detailed form corresponding to the preferred embodiment of the present invention. This portion (FIG. 2) of the receiver comprises the new elements of the present invention. As the other elements shown in FIG. 1 are well known in the art they are omitted from FIG. 2 for simplification.

The channel filter 8 comprises preferably a first IF amplifier 26, a surface wave filter 28 and a second IF amplifier 30. A surface wave device is preferred over a CL bandpass filter where very stable center frequency and bandwidth with sharp cutoff is required. The disadvantage lies with the signal losses inherent in a surface wave filter which necessitate the use of the amplifiers 26 and 30.

If the characteristics of a surface wave device filter are not needed, a capacitor inductor filter may be used for channel filter 8 thereby eliminating the requirement for amplifiers 26 and 30. The present invention automatically compensates for center frequency drift which is common in CL filters.

The IF signal passing through channel filter 8 is coupled to a cascaded set of seven logarithmic amplifiers 32. The logarithmic amplification is used to expand the effective AM dynamic range of the receiver by amplifying low level signals more than high level signals. Current is supplied to logarithmic amplifiers 32 by current source 31 coupled to a negative potential at input 33. The voltage at junction 35 of the current source and all the amplifiers 32 will be proportional to the logarithm of the amplitude of the IF signal. Operational amplifier 48, which may be, for example, a National Semiconductor type LM101A, detects the amplitude of the IF signals which carries signal information used to switch the discriminator output if necessary and for other system purposes.

FIG. 5 shows a logarithmic amplifier suitable for use as IF ampifiers 32. The IF signal from the channel filter 8 or a prior IF amplifier 32 is coupled to input 260 which is connected to the base of transistor 264. Resistor 262 connected from input 260 to ground biases the base of transistor 264 and acts as a load for the tuned output of the previous amplifier. The IF signal is coupled to the emitter of transistor 264 to which resistor 266 is connected to an RF ground at the junction of capacitor 270 and inductor 268. The other end of capacitor 270 is coupled to ground. The other end of inductor 268 is couple to common junction 35 with current source 31 (FIG. 2). The IF signal across resistor 266 generates a current in the collector of transistor 264. The collector current is driven through a load comprising variable inductor 272 in parallel with resistor 274 which are connected from the collector of transistor 264 to a positive potential at 282. Capacitor 276 couples the collector of transistor 264 to output 280 and capacitor 278 is coupled from output 280 to ground. The center frequency adjustment of each amplifier 32 (FIG. 2) is the adjustable inductor 272 which in combination with capacitors 276 and 278 form a tuned circuit.

Again referring to FIG. 2, the output of amplifier chain 32 is coupled through IF limiter 10 to the input of frequency discriminator 12. Frequency discriminator 12 comprises a phae splitter 34, filters 36 and 38 for each phase, a balanced phase detector 40 and differential amplifier 42. The phase splitter 34 generates two signals, one being in phase with the IF signal and one being 180° out of phase. The in-phase signal is coupled to bandpass filter 36 which has no effect on phase of the signal as long as it is at the proper frequency and there is zero feedback to the frequency standard control. This in-phase signal is then coupled to a first input of the balanced phase detector 40. The out-of-phase signal from splitter 34 is coupled to low pass filter 38 which adds an additional 90° of phase shift to signals at the design frequency. This out-of-phase signal is then coupled to a second input of the balanced phase detector 40. The frequency standard of discriminator 12 thus consists of filters 36 and 38.

The phase detector 40 has two outputs which will be equal if the inputs maintain their 270° phase difference. At a greater or lesser phase differential the outputs will not be equal. The outputs are coupled to the two inputs of differential amplifier 42 whose output is proportional to the difference between the two phase detector 40 outputs.

Frequency comparison of the IF signal passing through channel filter 8 to a reference is accomplished by this frequency discriminator because signals at other than the design frequency of filters 36 and 38 will cause a phase difference other than 270° at the phase detector 40 inputs. Thus the phase error actually detected is proportional to the frequency error.

The frequency standard adjustment is accomplished by feeding the output of differential amplifier 42 back through low pass filter 44, amplifier 46 and low pass filter 16, to bandpass filter 36. The feedback controls the capacitance of one of the tuning elements of filter 36, a varactor diode 120 (FIG. 3), and thereby adjusts the center frequency of the filter 36 (FIG. 2) to add to or subtract from the phase of the in-phase signal to the phase detector 40. In this way the phase changes caused by aging and temperature drift of the other frequency controlling components is compensated for.

In low frequency systems, tuning of filter 36 by use of a current variable inductor, in place of inductor 124 (FIG. 3), would be advantageous. The error feedback signal would then be converted into a bias current for the variable inductor.

Figure 3:
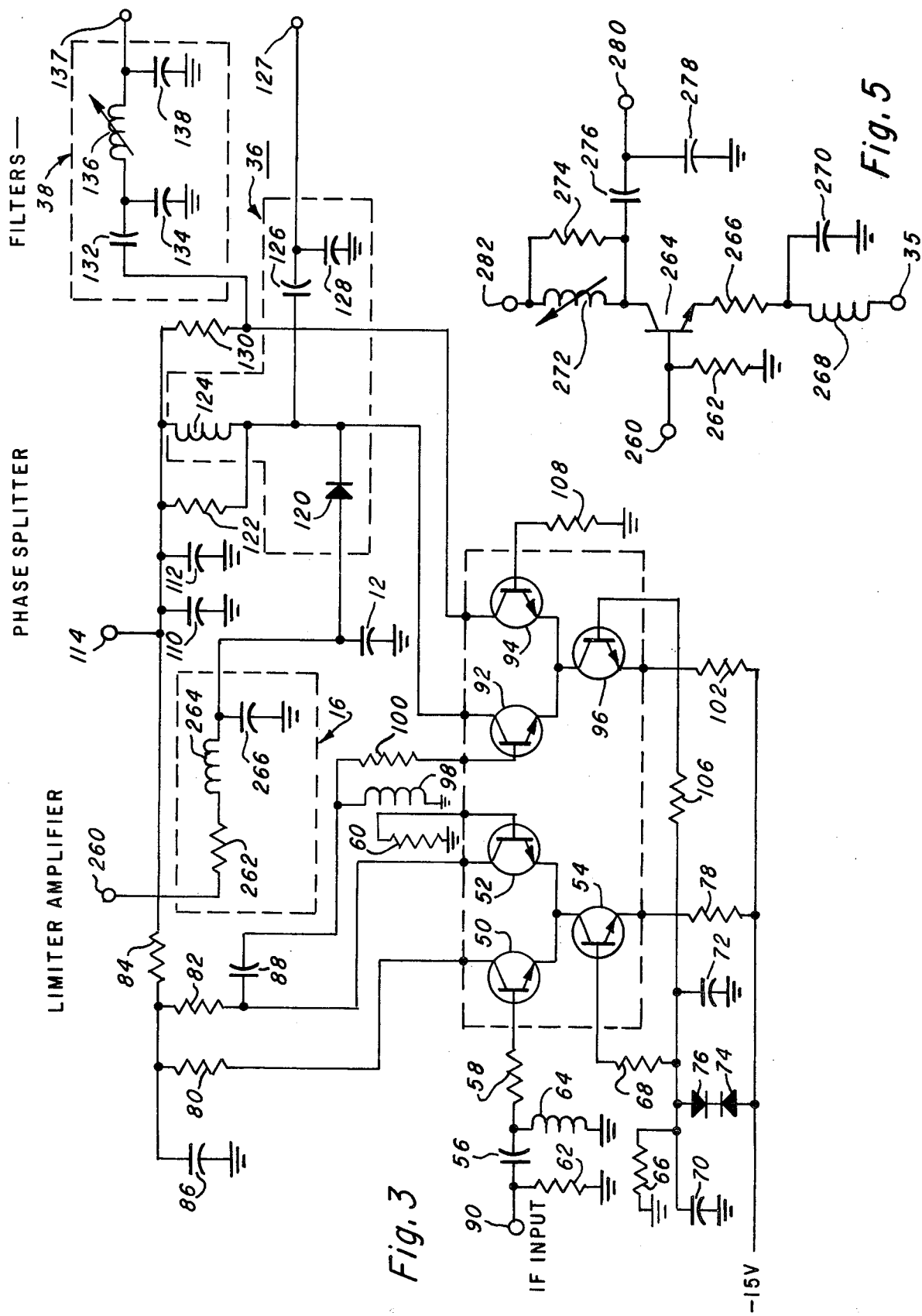
FIG. 3 is a schematic electrical diagram of the IF limiter amplifier, phase splitter amplifier, and frequency standard filter of FIG. 2.

FIG. 3 is a schematic diagram of the IF limiter amplifier 10, the phase splitter amplifier 34, and filters 16, 36 and 38 of FIG. 2. The limiter amplifier is a simple differential amplifier with transistors 50 and 52 forming the differential pair and transistor 54 the current source of the amplifier. One RCA integrated circuit device designated the CA 3049 contains six suitable transistors which are internally connected to form two differential transistor pairs with active current sources as required for the limiter amplifier. Transistors 50, 52, and 54 constitute one half of one of these devices.

The IF signal passing through channel filter 8 is coupled to input 90 of the limiter amplifier, which is biased at ground through resistor 62. The IF signal is coupled from input 90 through capacitor 56 and resistor 58 to the base of transistor 50. The base of transistor 50 is biased at ground by inductor 64 connected to the junction of capacitor 56 and resistor 58. The IF signal is coupled from the emitter of transistor 50 to the emitter of transistor 52, the base of which is biased at ground by resistor 60. The output signal appears as a voltage at the collector of transistor 52 which is loaded by resistor 82. The signal is coupled to the input of the phase splitter through capacitor 88.

Resistor 66, capacitors 70 and 72 and diodes 74 and 76 form a reference voltage source which biases the base of transistor 54 through resistor 68. This reference voltage and resistor 78 connected from the emitter of transistor 54 to a negative fifteen volt supply set the differential amplifier bias current in the collector of transistor 54. This reference voltage source also biases the base of transistor 96 through resistor 106 and together with resistor 102 connected from the emitter of transistor 96 to the negative fifteen volt supply sets the bias current in the collector of transistor 96. This current biases the differentially connected transistors 92 and 94 which form the phase splitter 34. Transistors 92, 94, and 96 constitute the other half of RCA CA 3049 device used for the limiter amplifier.

The output of the limiter amplifier is coupled through resistor 100 to the base of transistor 92 which is biased at ground through inductor 98. The signal is coupled from the emitter of transistor 92 to the emitter of transistor 94. The base of transistor 94 is coupled to ground through resistor 108. The current in the collector of transistor 92 is proportional to and in phase with the signal received from the limiter amplifier while the current in the collector of transistor 94 is proportional to and 180° out of phase with that signal. The collector of transistor 92 is coupled through a load comprising resistor 122 in parallel with inductor 124 to a positive power supply coupled to input 114. Inductor 124, diode 120, and the capacitors 126 and 128 coupled to the collector of transistor 92 form a bandpass filter which couples the IF signal to an input 127 of phase detector of FIG. 4.

The collector of transistor 94 is coupled through load resistor 130 to the positive power supply. The signal generated at the collector of transistor 94 is coupled through capacitor 132 to a low pass filter comprising shunt capacitor 134, series inductor 136 and shunt capacitor 138. The signal passing through this filter is delayed an additional 90° and is coupled to another input 137 of the phase detector.

Figure 4:
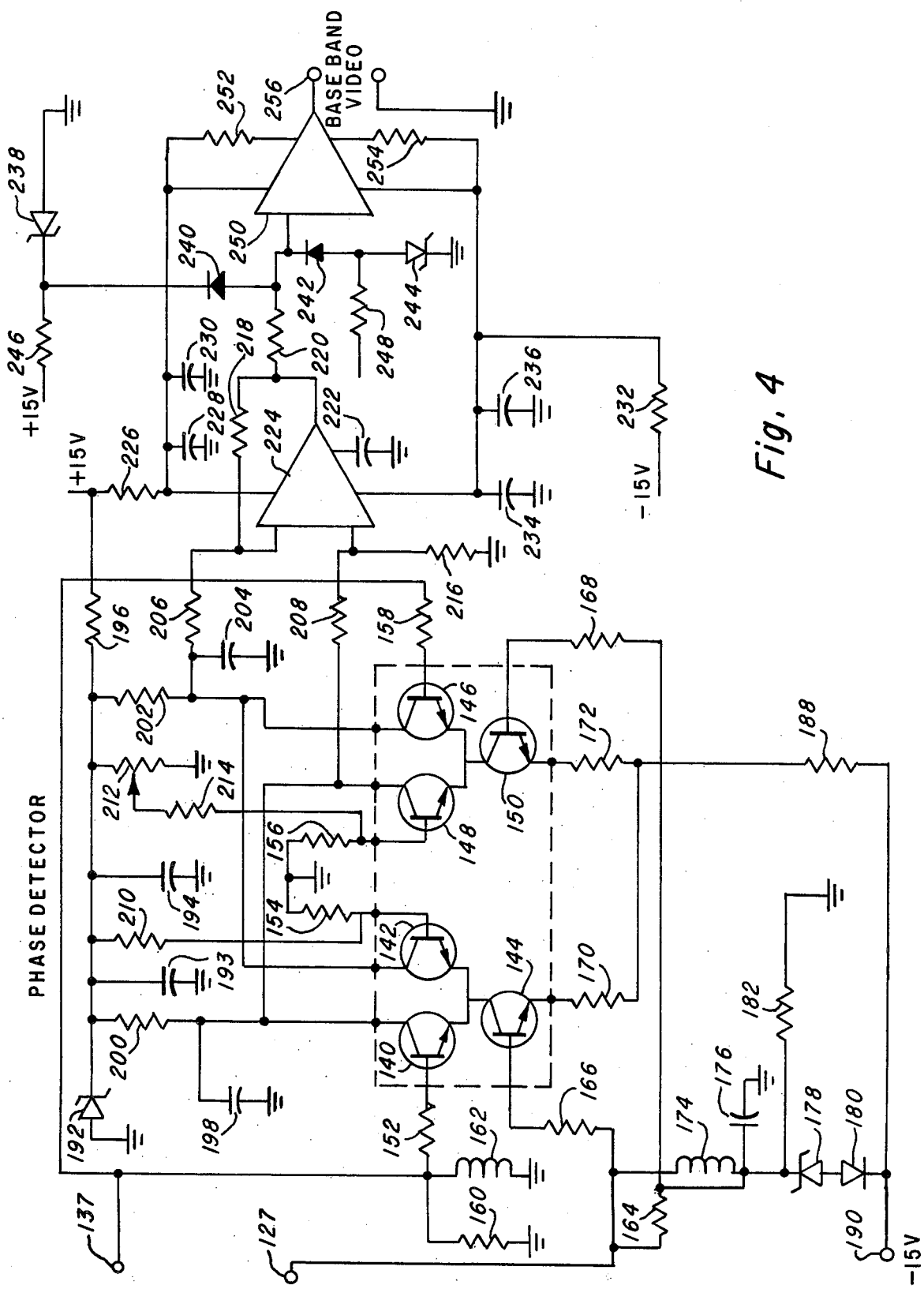
FIG. 4 is an electrical schematic diagram of the balanced phase detector and differential amplifier of FIG. 2.

FIG. 4 is a schematic diagram of the balanced phase detector 40 and the differential amplifier 42 of FIG. 2. The balanced phase detector comprises six transistors 140, 142, 144, 146, 148, and 150. A suitable phase detector is formed from one RCA integrated circuit device designated the CA 3049 which contains six suitable transistors internally connected in the differential amplifier configuration required. Transistors 140 and 142 form a differential pair with transistor 144 acting as a current source. Transistors 148 and 146 form another differential pair with transistor 150 acting as a current source. The two current source transistors 144 and 150 form a third differential pair with resistor 188 connected to the negative voltage source coupled to input 190 acting as a current source. The emitters of transistors 144 and 150 are coupled to the current source resistor 188 by resistors 170 and 172 respectively. A bias voltage for the bases of transistors 144 and 150 is generated by the power supply comprising diodes 178 and 180, resistor 182 and capacitor 176. The bias voltage is coupled to the base of transistor 150 by resistor 168. The bias voltage is coupled to the base of transistor 150 by resistor 168. The bias voltage is coupled to the base of transistor 144 by inductor 174 in series with resistor 166. Input 127 receives the IF signal passing through filter 36 (FIG. 3) and couples it to the junction of inductor 174 and resistor 166. Resistor 166 couples the IF signal to the base of resistor 144, but the inductor 174 is not conductive at IF and prevents the IF signal from reaching the bias supply, which is an AC ground. Resistor 164, coupled from input 127 to the AC ground at the bias supply, acts as a matching load for filter 36 (FIG. 3).

Input 137 receives the signal from low pass filter 38 (FIG. 3) and couples it through resistors 152 and 158 to the bases of transistors 140 and 146 respectively. Input 137 is biased at ground potential through resistor 160 and inductor 162. Transistors 142 and 148 have bases approximately at ground potential through resistors 154 and 156 respectively. Resistor 210 coupled from the base of transistor 142 to the positive power supply raises the base slightly above ground potential. Resistor 214 and potentiometer 212 coupled from the base of transistor 148 to the positive power supply raise this base slightly above ground potential and allow adjustment to balance differential pair 146 and 148 against differential pair 142 and 140. The positive supply for this phase detector consists of diode 192, capacitors 193 and 194 and resistor 196.

The outputs of the two differential pairs consist of currents in the collectors of transistors 140, 142, 146 and 148. The collectors of transistors 140 and 148 are connected together to add currents which are driven through load resistor 200 to generate a voltage which is low pass filtered by shunt capacitor 198. This voltage is coupled through resistor 208 to one input of differential amplifier 224 which is also coupled to ground through resistor 216.

The collectors of transistors 142 and 146 are connected together to add currents which are driven through load resistor 202 to generate a voltage which is low pass filtered by capacitor 204. This voltage is coupled thorough resistor 206 to the other input of differential amplifier 224, to which input the output is also fed back through resistor 218. Differential amplifier 224 may be, for example, a Harris Semiconductor type HA 2522. Capacitor 222 limits the frequency response of amplifier 224. The output of amplifier 224 is coupled through resistor 220 to the input of line driver 250. Line driver 250 may be, for example, a National Semiconductor type NH 0002 device which is needed to drive heavier loads than amplifier 224 is capable of driving. The input of line driver 250 is voltage limited, or clamped, above ground potential by diodes 238 and 240 and resistor 246, and below ground potential by diodes 242 and 244 and resistor 248.

Positive power is supplied to amplifiers 224 and 250 through resistor 226 and decoupled by capacitors 228 and 230. Negative power is supplied through resistor 232 and decoupled by capacitors 234 and 236. Resistors 252 and 254 supply power to and limit current in the output stage of line driver 250.

The output of line driver 250 is coupled to output 256 and is a voltage proportional to the difference between the frequency of the input signal to input 90 (FIG. 3) and the design frequency of filters 36 and 38 (FIG. 3). This signal is coupled through the low pass filter 44 and DC amplifier 46 of FIG. 3. Filter 16 consists of series resistor 262 and inductor 264 and shunt capacitor 266 and has a very low cutoff frequency, on the order of one Hertz. This low frequency prevents the discriminator output during the short period of received RF pulses from affecting the signal to the frequency adjusting element 120 (FIG. 3).

As explained above under the description of FIG. 2 the feedback to the frequency standard maintains the standard at the actual center frequency of channel filter 8 (FIG. 2). If a conventional capacitor filter is used for filter 8 the inherent drift in center frequency will be followed by the discriminator frequency standard. This will result in operation of the receiver at an IF other than the nominal IF, but will maintain optimum sensitivity. If system operation conditions, such as narrow channel spacing, require a substantially fixed IF, then a very stable channel filter, such as the surface wave device of the preferred embodiment, must be used.

It will be apparent that the present invention may be used to automatically center receivers of substantially continuous FM signals. The discriminator frequency standard could be centered by blocking the received RF signal periodically to generate a frequency standard error signal and storing this signal in a sample and hold gate 17 as shown in FIG. 1. Where only long term drift is being corrected the centering cycles could be far apart, causing only minimal loss of received signals.

Although the present invention has been shown and illustrated in terms of specific apparatus, it will be apparent that changes or modifications can be made without departing from the spirit and scope of the invention as defined by the appended claims.

What is claimed is:

1. A pulsed frequency modulated, radio frequency (RF) receiver comprising:
    an antenna 2 for receiving an RF signal;
    a voltage controlled local oscillator 24;
    a mixer 4 coupled to said antenna and local oscillator for mixing the received RF signal and the local oscillator signal to produce an IF signal;
    an amplifier means 6 for amplifying said IF signal and inherent noise of the amplifier;
    a bandpass filter 8 having characteristics matched to the desired incoming signals for filtering said IF signal and/or noise for matching to the incoming signal waveform;
    a signal presence detection means 18 & 20 for detecting the presence or absence of a received signal plus noise or noise alone;
    a frequency discriminator means 12 for comparing said filtered IF signal with a tunable frequency standard contained in said frequency discriminator, said frequency standard being tunable for providing a selected frequency for outputting zero voltage;
    a switching means 14 connected to said frequency discriminator means;
    a first low pass filter means 16 connected to a first output of said switch for tuning said frequency standard in the absence of a received RF signal, said low pass filter operative to measure the average voltage out of the discriminator when the RF signal is absent and to retain this voltage average during switching; and
    a second low pass filter means 22 connected to a second output of said switch for tuning said local oscillator in the presence of an RF signal, said filter operative to measure the average voltage during switching to said first low pass filter, whereby the zero voltage output of said discriminator during the presence of bandpass filter noise only provides a reference of the bandpass filter centering for use during the presence of an RF signal for centering the resulting IF signal on the reference.

2. A receiver according to claim 1 wherein the voltage variable tuning element is a varactor diode.

3. A radio frequency receiver including a bandpass filter for receiving pulsed FM signals comprising:
    a frequency discriminator having a first input for receiving intermediate frequency signals and/or bandpass filtered noise, and an output centered on the noise output of the receiver bandpass filter;
    a discriminator feedback circuit means connected to a second input for coupling said frequency discriminator output to tune said bandpass filter in the absence of received RF signals; and
    a feedback means for maintaining the received RF signals at the center frequency of said discriminator during receipt of RF signals.

4. A receiver according to claim 3 wherein the discriminator feedback means and the feedback smoothing means is a low pass filter.

5. A radio frequency receiver for receiving pulsed FM signals comprising:
    (a) a local oscillator having an output for producing RF signal and an input for receiving a voltage for controlling the frequency of said RF output;
    (b) a receiver input for receiving RF signals;
    (c) a mixer having a first input coupled to the receiver input and a second input coupled to the LO output and an output for producing an IF signal which is the product of the two input signals;
    (d) an IF amplifier having an input coupled to the mixer output and an output for providing an amplified IF signal;
    (e) a bandpass filter having an input coupled to the IF amplifier output and an output for passing IF signals within a pre-selected frequency band;
    (f) a frequency discriminator having a first input coupled to the bandpass filter output, a voltage tuned frequency standard, a second input for receiving a voltage for tuning said frequency standard, and an output for producing a video signal proportional to the frequency difference between the signal received by said first input between received RF pulses and said frequency standard;
    (g) LO feedback means for coupling said discriminator output to the LO input during receiver RF pulses;
    (h) discriminator feedback and smoothing means for coupling the discriminator output to the discriminator second input between received RF pulses and maintaining the signal at the discriminator second input constant during received RF pulses.

6. A receiver according to claim 5 wherein the LO feedback means is a first low pass filter and the discriminator feedback means and feedback smoothing means is a second low pass filter.

7. An improved radio frequency receiver for receiving pulsed signals comprising the combination of:
    (a) a receiver signal processing means for producing an IF signal having a selected center frequency;
    (b) a frequency discriminator having a first input terminal coupled to the receiver signal processing means;
    (c) a tunable frequency standard coupled to a second input terminal of the frequency discriminator, said discriminator comparing the IF signal between received signal pulses with the frequency standard and producing an output representative of the frequency standard error; and (d) a switch coupled to the discriminator output for feeding back the signal representative of the frequency standard error to said tunable frequency standard between received pulses to reduce the error to zero, and to the receiver signal processing means during received pulses to center the IF signals on the actual input passband.

8. A receiver according to claim 7 wherein the receiver signal processing means comprises a voltage controlled local oscillator having an input coupled to the frequency discriminator output and a mixer coupled to the local oscillator output.

9. A receiver according to claim 7 including feedback smoothing means for maintaining the feedback to the tunable frequency standard producing means constant during received pulses.

10. A receiver according to claim 9 wherein the feedback smoothing means is a low pass filter.

11. A receiver according to claim 9 wherein the feedback smoothing means is a sample and hole gate.

12. In a pulsed radio frequency receiver having an input bandpass filter which passes only those frequencies within a pre-selected range, an intermediate frequency amplifier which receives signals from the input bandpass filter, and a frequency discriminator which receives signals from the intermediate frequency amplifier and which has an internal adjustable frequency standard, a method for centering the intermediate frequency of the receiver at the true center of the input filter passband comprising the steps of:

(a) comparing in said frequency discriminator the center frequency of the noise spectrum passing through said intermediate frequency amplifier between signal pulses with that of said adjustable frequency standard in said frequency discriminator to provide a difference signal representing any error therein; and (b) applying the said difference signal to said adjustable frequency standard between signal pulses, thereby adjusting said intermediate frequency signal of said receiver to center said intermediate frequency signal on the actual input passband of said input bandpass filter.

* * * * *